United States Patent
Cha et al.

(10) Patent No.: US 10,204,005 B2
(45) Date of Patent: Feb. 12, 2019

(54) ERROR DETECTION CIRCUIT AND SEMICONDUCTOR APPARATUS USING THE SAME

(71) Applicant: SK hynix Inc., Icheon-si, Gyeonggi-do (KR)

(72) Inventors: Jin Youp Cha, Icheon-si (KR); Yu Ri Lim, Icheon-si (KR)

(73) Assignee: Sk hynix Inc., Icheon-si, Gyeonggi-do (KR)

( * ) Notice: Subject to any disclaimer, the term of this patent is extended or adjusted under 35 U.S.C. 154(b) by 225 days.

(21) Appl. No.: 14/711,491

(22) Filed: May 13, 2015

(65) Prior Publication Data

US 2016/0253228 A1 Sep. 1, 2016

(30) Foreign Application Priority Data

Feb. 27, 2015 (KR) ........................ 10-2015-0028589

(51) Int. Cl.
| | |
|---|---|
| G06F 11/08 | (2006.01) |
| G11C 17/16 | (2006.01) |
| G11C 17/18 | (2006.01) |
| G11C 29/02 | (2006.01) |
| G06F 11/32 | (2006.01) |

(52) U.S. Cl.
CPC .............. G06F 11/08 (2013.01); G11C 17/16 (2013.01); G11C 17/18 (2013.01); G11C 29/027 (2013.01)

(58) Field of Classification Search
CPC ......... G06F 11/08; G11C 17/16; G11C 17/18; G11C 29/027
See application file for complete search history.

(56) References Cited

U.S. PATENT DOCUMENTS

| 5,323,355 A * | 6/1994 | Kato .................... G11C 7/1033 365/193 |
| 7,360,142 B1 * | 4/2008 | Barash ................. H03M 13/09 714/758 |
| 2002/0133731 A1 * | 9/2002 | Johnson .................... G06F 1/12 713/400 |

(Continued)

FOREIGN PATENT DOCUMENTS

KR 1020150062774 A 6/2015

*Primary Examiner* — April Y Blair
*Assistant Examiner* — Dipakkumar B Gandhi
(74) *Attorney, Agent, or Firm* — William Park & Associates Ltd.

(57) ABSTRACT

An error detection circuit may include a selection unit that sequentially selects a primary data group and a secondary data group according to a first control signal and generates an output signal; a first operation unit that performs an error detection operation on the output signal and outputs a preliminary error operation signal; a storage unit that latches the preliminary error operation signal and output a latched signal according to a second control signal; a second operation unit that performs an error detection operation on a previous preliminary error operation signal outputted from the storage unit and a current preliminary error operation signal outputted from the first operation unit and generates an internal error operation signal; and a comparison unit that compares the internal error operation signal with an external error operation signal and outputs a result of the comparison as an error detection signal.

15 Claims, 4 Drawing Sheets

(56) References Cited

U.S. PATENT DOCUMENTS

| | | | |
|---|---|---|---|
| 2003/0226090 A1* | 12/2003 | Thayer | G06F 11/1016 |
| | | | 714/763 |
| 2004/0111590 A1* | 6/2004 | Klein, Jr. | G06F 9/30181 |
| | | | 712/226 |
| 2006/0120207 A1* | 6/2006 | Lee | G11C 7/1051 |
| | | | 365/193 |
| 2008/0130534 A1* | 6/2008 | Tomioka | H04L 1/0009 |
| | | | 370/310 |
| 2011/0041035 A1* | 2/2011 | Song | G06F 11/1004 |
| | | | 714/757 |

* cited by examiner

| | 0 | 1 | 2 | 3 | 4 | 5 | 6 | 7 | 8 | 9 |
|---|---|---|---|---|---|---|---|---|---|---|
| DQ0 | d0 | d1 | d2 | d3 | d4 | d5 | d6 | d7 | CRC0 | 1 |
| DQ1 | d8 | d9 | d10 | d11 | d12 | d13 | d14 | d15 | CRC1 | 1 |
| DQ2 | d16 | d17 | d18 | d19 | d20 | d21 | d22 | d23 | CRC2 | 1 |
| DQ3 | d24 | d25 | d26 | d27 | d28 | d29 | d30 | d31 | CRC3 | 1 |
| DQ4 | d32 | d33 | d34 | d35 | d36 | d37 | d38 | d39 | CRC4 | 1 |
| DQ5 | d40 | d41 | d42 | d43 | d44 | d45 | d46 | d47 | CRC5 | 1 |
| DQ6 | d48 | d49 | d50 | d51 | d52 | d53 | d54 | d55 | CRC6 | 1 |
| DQ7 | d56 | d57 | d58 | d59 | d60 | d61 | d62 | d63 | CRC7 | 1 |
| DBI | d64 | d65 | d66 | d67 | d68 | d69 | d70 | d71 | 1 | 1 |

ERROR DETECTION CIRCUIT AND SEMICONDUCTOR APPARATUS USING THE SAME

CROSS-REFERENCES TO RELATED APPLICATION

The present application claims priority under 35 U.S.C. § 119(a) to Korean application number 10-2015-0028589, filed on Feb. 27, 2015, in the Korean Intellectual Property Office, which is incorporated herein by reference in its entirety as set forth in full.

BACKGROUND

1. Technical Field

Various embodiments relate to a semiconductor circuit, and more particularly, to an error detection circuit and a semiconductor apparatus using the same.

2. Related Art

A semiconductor circuit, for example, a data processing apparatus uses an error detection circuit for detecting the presence or absence of an error through a series of data operations in order to cope with the probability of a data input/output error.

The error detection circuit may use CRC (Cyclic Redundancy Check) as an error detection operation scheme.

An error detection circuit according to the conventional art compares an error detection operation result of all pieces of data inputted from an external system, for example, a memory controller, with error detection data provided by the external system, and detects a data transmission error.

Therefore, an area burden of a logic circuit for performing an error detection operation for all pieces of data inputted from the external system is large, resulting in a problem that a logic skew for the error detection operation increases.

SUMMARY

In an embodiment, an error detection circuit may include a selection unit configured to sequentially select a primary data group and a secondary data group according to a first control signal, and generate an output signal. The error detection circuit may also include a first operation unit configured to perform an error detection operation on the output signal of the selection unit, and output a result of the error detection operation as a preliminary error operation signal. The error detection circuit may also include a storage unit configured to latch the preliminary error operation signal and output a latched signal according to a second control signal. The error detection circuit may also include a second operation unit configured to perform an error detection operation on a previous preliminary error operation signal outputted from the storage unit and a current preliminary error operation signal outputted from the first operation unit, and generate a result of the error detection operation as an internal error operation signal. The error detection circuit may also include a comparison unit configured to compare the internal error operation signal with an external error operation signal, and output a result of the comparison as an error detection signal.

In an embodiment, a semiconductor apparatus may include a memory block. The semiconductor apparatus may also include an input data processing unit configured to align external data according to an input control clock signal and generate alignment data. The semiconductor apparatus may also include an error detection circuit configured to sequentially perform a primary error detection operation on a primary data group and a secondary data group of the external data, perform a secondary error detection operation on results of the primary error detection operation, and generate an error detection signal for determining a presence or an absence of an error of the external data.

In an embodiment, an error detection circuit includes a selection unit configured to select one of a primary data group and a secondary data group according to a first control signal and to generate an output signal. The error detection circuit also includes a first operation unit configured to receive the output signal and perform an error detection operation and generate a preliminary error operation signal. The error detection circuit also includes a storage unit configured to output a latch signal by latching the preliminary error operation signal according to a second control signal. The error detection circuit also includes a second operation unit configured to perform an error detection operation on the latch signal and the preliminary error operation signal and output an internal error operation signal. The error detection circuit also includes a comparison unit configured to compare the internal error operation signal to an external error operation signal and output an error detection signal.

DETAILED DESCRIPTION

Hereinafter, an error detection circuit and a semiconductor apparatus using the same according to the invention will be described in detail with reference to the accompanying figures through an embodiment. An error detection circuit capable of reducing a circuit area for error detection and a skew of an error detection operation and a semiconductor apparatus using the same are described herein.

Figure 1:
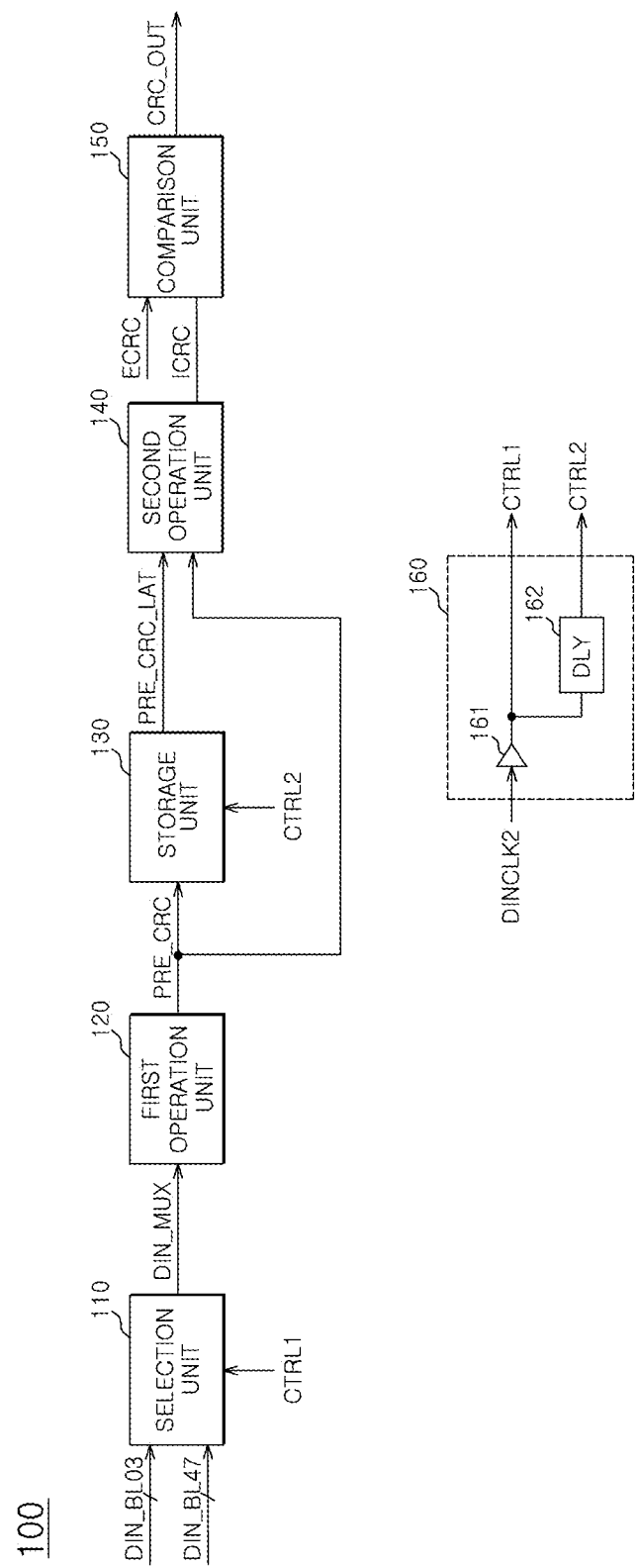
FIG. 1 is a diagram illustrating a configuration of an error detection circuit 100 according to an embodiment.

Referring to FIG. 1, an error detection circuit 100 according to an embodiment will be described below.

As illustrated in FIG. 1, the error detection circuit 100 according to an embodiment may include a selection unit 110, a first operation unit 120, a storage unit 130, a second operation unit 140, a comparison unit 150, and a control signal generation unit 160.

In a write operation of a semiconductor apparatus, an external system, for example, a memory controller such as a CPU or a GPU, may input data to the semiconductor apparatus according to a preset burst length (BL).

Figures 2, 3:
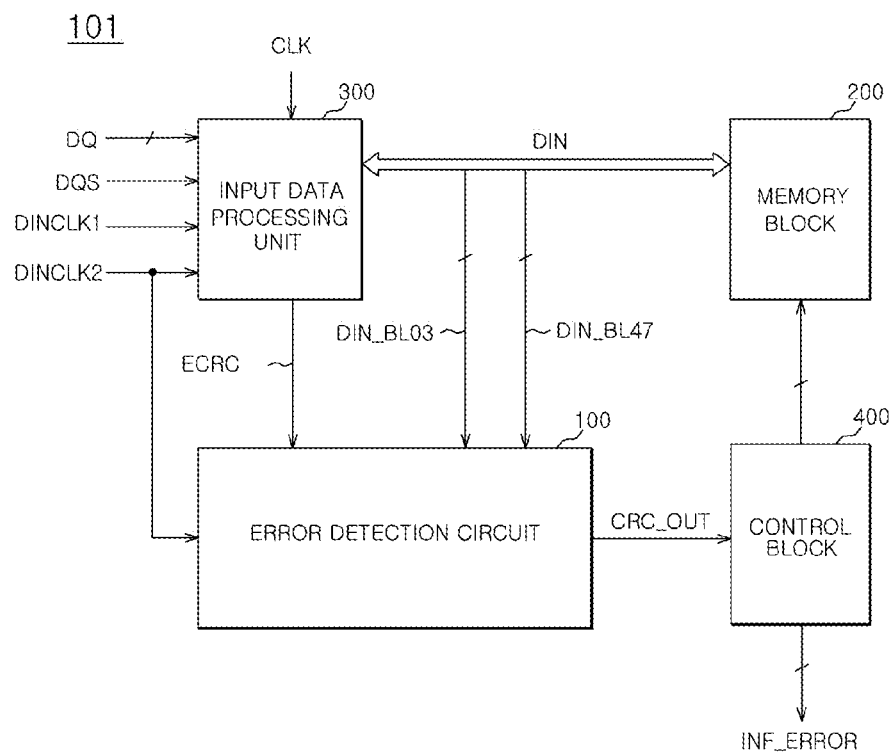
FIG. 2 is a data bit mapping table.
FIG. 3 is a diagram illustrating a configuration of a semiconductor apparatus 101 according to an embodiment.

Referring to FIG. 2, a bit mapping table when the burst length is '8' (hereinafter, BL=8) is shown. In FIG. 2, 8-bit data d0 to d63 may be sequentially input to each of input/output pads DQ0 to DQ7 according to a one-time write command.

Error detection signals CRC0 to CRC7 may be additionally input to each of the input/output pads DQ0 to DQ7.

Furthermore, data bus inversion information d64 to d71 may be additionally input through a data bus inversion pad DBI.

Hereinafter, an error detection signal provided by the external system will be referred to as an external error detection signal ECRC.

The external error detection signal ECRC may include CRC0 to CRC7.

Among the 8-bit data d0 to d63 sequentially inputted to each of the input/output pads DQ0 to DQ7 and the data bus inversion pad DBI according to the one-time write command, 4-bit data corresponding to the half and latched at a first timing will be referred to as a primary data group DIN_BL03.

Among the 8-bit data d0 to d63, 4-bit data corresponding to the other half and latched at a second timing after the first timing will be referred to as a secondary data group DIN_BL47.

Referring again to FIG. 1, the control signal generation unit 160 may generate a first control signal CTRL1 and a second control signal CTRL2 by using signals for providing timings for generating the primary data group DIN_BL03 and the secondary data group DIN_BL47.

As the signals for providing the timings for generating the primary data group DIN_BL03 and the secondary data group DIN_BL47, a first input control clock signal DIN-CLK1 and a second input control clock signal DINCLK2 to be described later may be used.

The control signal generation unit 160 may generate the first control signal CTRL1 and the second control signal CTRL2 by using one of the first input control clock signal DINCLK1 and the second input control clock signal DIN-CLK2, such as for example, the second input control clock signal DINCLK2.

The control signal generation unit 160 may include a buffer 161 and a delay section 162.

The buffer 161 may buffer the second input control clock signal DINCLK2. The buffer 161 may also output the first control signal CTRL1.

The delay section 162 may delay the first control signal CTRL1 by a preset delay time. The delay section 162 may also output the second control signal CTRL2.

The delay time of the delay section 162 may be a time corresponding to logic delay of the first operation unit 120, or, a time required for an error detection operation.

The selection unit 110 may select one of the primary data group DIN_BL03 and the secondary data group DIN_BL47 in response to the first control signal CTRL1. The selection unit 110 may also generate an output signal DIN_MUX.

The selection unit 110 may sequentially select the primary data group DIN_BL03 and the secondary data group DIN_BL47 in response to the first control signal CTRL1. The selection unit 110 may also generate the output signal DIN_MUX.

When the first control signal CTRL1 is deactivated (for example, when the first control signal CTRL1 is at a low level), the selection unit 110 may select the primary data group DIN_BL03. The selection unit 110 may also generate the output signal DIN_MUX.

When the first control signal CTRL1 is activated (for example, when the first control signal CTRL1 is at a high level), the selection unit 110 may select the secondary data group DIN_BL47. Further, the selection unit 110 may generate the output signal DIN_MUX.

The first operation unit 120 may perform an error detection operation on the output signal DIN_MUX of the selection unit 110. The first operation unit 120 may also output a result of the error detection operation as a preliminary error operation signal PRE_CRC.

The first operation unit 120 may sequentially receive the output signal DIN_MUX of the selection unit 110 according to the primary data group DIN_BL03 and the output signal DIN_MUX of the selection unit 110 according to the secondary data group DIN_BL47. The first operation unit 120 may perform the error detection operation on the respective output signals. Further, the first operation unit 120 may sequentially generate the preliminary error operation signal PRE_CRC.

The first operation unit 120 may include a plurality of logic gates for performing a CRC (Cyclic Redundancy Check) error detection operation, or, a plurality of exclusive OR gates (XORs).

Since the first operation unit 120 may perform the error detection operation on the half of the entire data, that is, the primary data group DIN_BL03 or the secondary data group DIN_BL47, the first operation unit 120 may include a reduced number of logic gates as compared with the case of performing the error detection operation on the entire data.

The storage unit 130 may output a latch signal PRE_CRC_LAT obtained by latching the preliminary error operation signal PRE_CRC outputted from the first operation unit 120 according to the second control signal CTRL2.

The storage unit 130 may output a preliminary error operation signal PRE_CRC, inputted at a previous timing, at a timing at which the first operation unit 120 currently outputs a preliminary error operation signal PRE_CRC.

The second operation unit 140 may perform an error detection operation on the latch signal PRE_CRC_LAT of the storage unit 130 and the preliminary error operation signal PRE_CRC currently outputted from the first operation unit 120. The second operation unit 140 may also output a result of the error detection operation as an internal error operation signal ICRC.

The second operation unit 140 may simultaneously receive the latch signal PRE_CRC_LAT, that is, the previous preliminary error operation signal PRE_CRC, and the current preliminary error operation signal PRE_CRC.

Since the second operation unit 140 performs the error detection operation on the 1-bit latch signal PRE_CRC_LAT and the 1-bit preliminary error operation signal PRE_CRC, the second operation unit 140 may include one exclusive OR gate.

The comparison unit 150 may compare the internal error operation signal ICRC with the external error operation signal ECRC. The comparison unit 150 may also output a result of the comparison as an error detection signal CRC_OUT.

The comparison unit 150 may output the error detection signal CRC_OUT at different levels when values of the internal error operation signal ICRC and the external error operation signal ECRC coincide with other and do not coincide with other Referring to FIG. 3, a semiconductor apparatus 101 according to an embodiment will be described below.

The semiconductor apparatus 101 according to an embodiment may include a memory block 200, an input data processing unit 300, a control block 400, and an error detection circuit 100.

The memory block 200 may store alignment data DIN.

The input data processing unit 300 may receive data DQ provided by the external system according to a strobe signal DQS.

The external system may provide the semiconductor apparatus 101 with the data DQ in synchronization with a clock signal CLK.

The external system may put a result obtained by performing an error detection operation on data transmitted by the external system into the data DQ. The external system may also transmit the data DQ.

The input data processing unit 300 may align the data DQ provided by the external system according to the first input control clock signal DINCLK1 and the second input control clock signal DINCLK2. The input data processing unit 300 may also generate the alignment data DIN.

The input data processing unit 300 may extract the error detection operation result included in the data DQ. The input data processing unit 300 may also output the external error operation signal ECRC.

The error detection circuit 100 may sequentially perform a primary error detection operation on the primary data group DIN_BL03 corresponding to the half of the data DQ inputted from the external system according to a one-time write command and latched at the first timing and the secondary data group DIN_BL47 corresponding to the other half of the data DQ and latched at the second timing after the first timing. The error detection circuit 100 may also perform a secondary error detection operation on results of the primary error detection operations, thereby determining the presence or absence of a data error.

The error detection circuit 100 may compare an internal error operation signal generated by performing the secondary error detection operation with an external error operation signal provided by the external system. The error detection circuit 100 may also generate the error detection signal CRC_OUT.

The error detection circuit 100 may use the configuration according to FIG. 1 described above.

The control block 400 may control the memory block 200 according to the error detection signal CRC_OUT to substantially prevent the alignment data DIN from being stored in the memory block 200.

When the values of the internal error operation signal ICRC and the external error operation signal ECRC coincide, that is, when there is no error in the data, the error detection signal CRC_OUT may have a predetermined logic level, that is, a high level.

However, when the values of the internal error operation signal ICRC and the external error operation signal ECRC do not coincide, that is, when there is an error in the data, the error detection signal CRC_OUT may have a predetermined logic level, that is, a low level.

The control block 400 may provide the external system with error occurrence information INF_ERROR according to the error detection signal CRC_OUT.

When the logic level of the error detection signal CRC_OUT is a level corresponding to the case in which there is an error in the data, the control block 400 may transmit the error occurrence information INF_ERROR for requesting data retransmission to the external system.

The external system may retransmit data to the semiconductor apparatus 101 according to the error occurrence information INF_ERROR.

Figure 4:
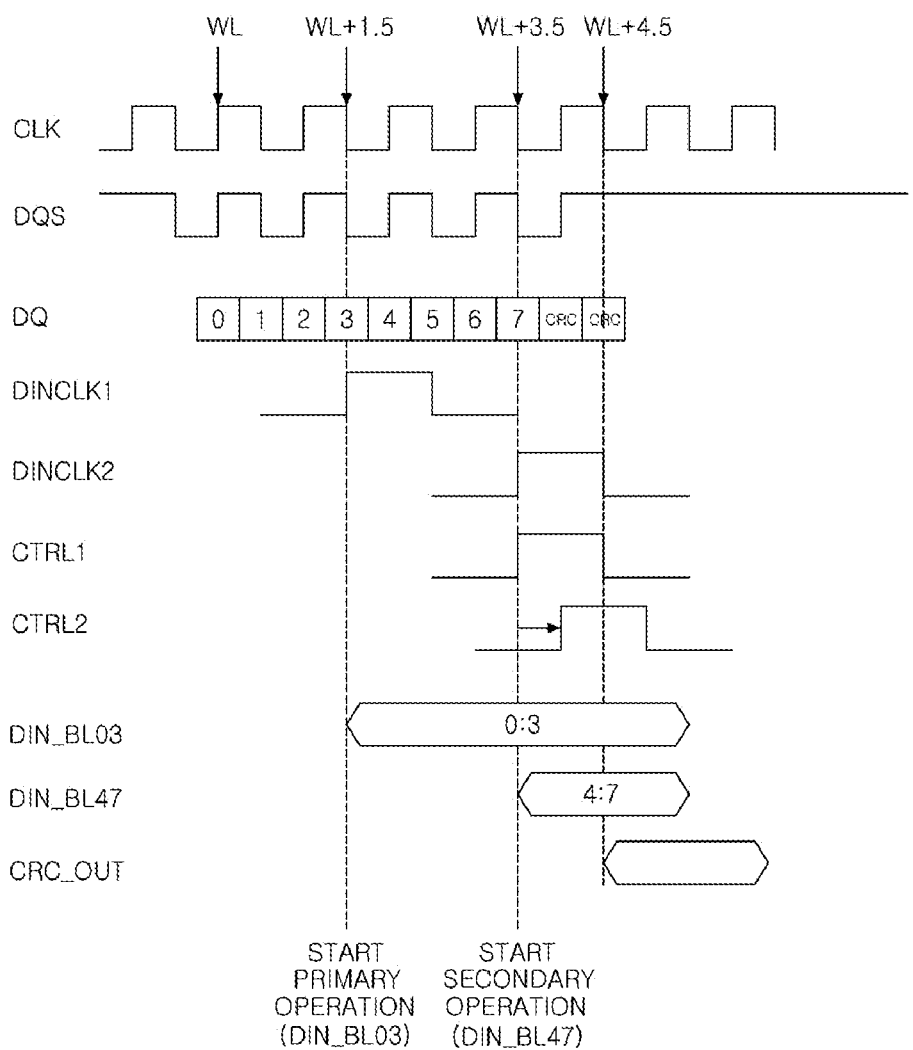
FIG. 4 is a timing diagram for explaining an error detection operation of a semiconductor apparatus 101 according to an embodiment.

Referring to FIG. 4, an error detection operation of the semiconductor apparatus 101 according to an embodiment will be described below.

A write command is inputted from the external system. Further, the data DQ is sequentially inputted according to a predetermined burst length (for example, BL8) after predetermined write latency WL on the basis of the clock signal CLK.

The input data processing unit 300 may receive the data DQ according to the strobe signal DQS.

The input data processing unit 300 may latch the data DQ at the first timing, for example, a 1.5 tCK time point (WL+1.5) from the write latency according to the first input control clock signal DINCLK1. The input data processing unit 300 may also generate the primary data group DIN_BL03.

When the first control signal CTRL1 has a predetermined logic level (for example, a low level), the error detection circuit 100 may perform the primary error detection operation on the primary data group DIN_BL03. The error detection circuit 100 may also store a result of the primary error detection operation.

The input data processing unit 300 may latch the data DQ at the second timing, for example, a 3.5 tCK time point (WL+3.5) from the write latency according to the second control signal CTRL2. The input data processing unit 300 may also generate the secondary data group DIN_BL47.

When the first control signal CTRL1 has a predetermined logic level (for example, a high level), the error detection circuit 100 may perform the secondary error detection operation on the secondary data group DIN_BL47.

When the second control signal CTRL2 has a predetermined logic level (for example, a high level), the error detection circuit 100 may perform the error detection operation on a result of the secondary error detection operation and the stored result of the primary error detection operation. The error detection circuit 100 may also generate the internal error operation signal ICRC. The error detection circuit 100 may also compare the internal error operation signal ICRC with the external error operation signal ECRC. Further, the error detection circuit 100 may also generate the error detection signal CRC_OUT at a third timing, for example, a 4.5 tCK time point (WL+4.5) from the write latency.

When the logic level of the error detection signal CRC_OUT is a level corresponding to the case in which there is an error in the data, the control block 400 may substantially prevent data from being stored in the memory block 200. The control block 400 may also transmit the error occurrence information INF_ERROR for requesting data retransmission to the external system.

The external system may retransmit data to the semiconductor apparatus 101 according to the error occurrence information INF_ERROR.

In the aforementioned embodiment, before entire data is inputted, that is, at the time point at which data corresponding to the half of the entire data is inputted, the error detection operation is performed in advance on the inputted half data, a result of the error detection operation is stored. Further, a simple error operation is performed on the stored result of the error detection operation and a result of an error detection operation on inputted data corresponding to the other half of the entire data so that it is possible to finally determine the presence or absence of a data error. Consequently, it is possible to reduce a logic skew of an error detection operation as well as a circuit area for an error detection operation.

Figure 5:
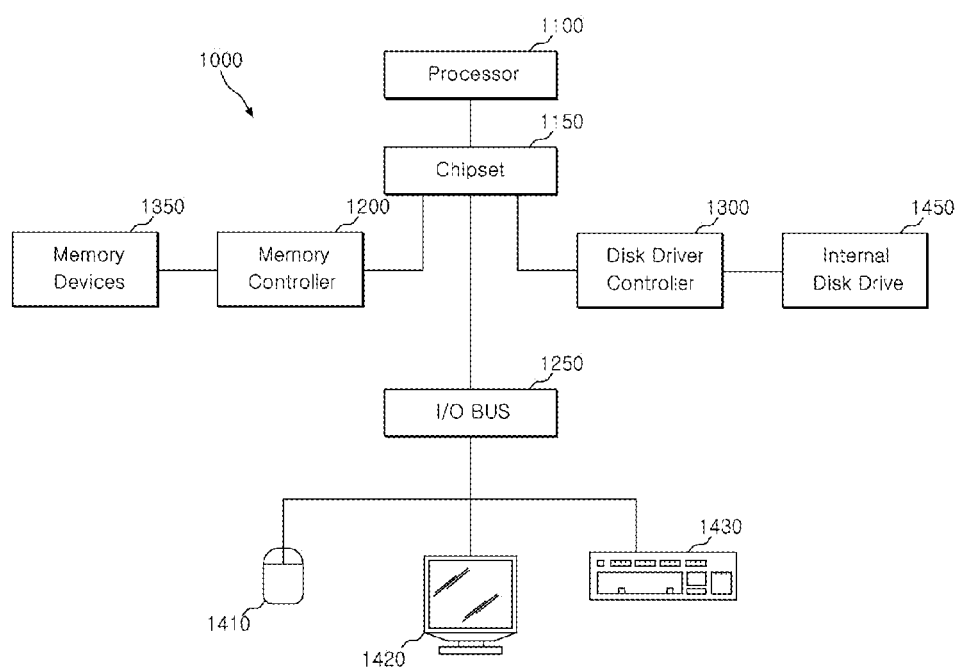
FIG. 5 illustrates a block diagram of a system employing a memory controller circuit in accordance with an embodiment of the invention.

Referring to FIG. 5, a system 1000 may include one or processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive request provided from the processor 1100 through the chipset 1150. The memory controller 1200 may be electrically coupled to one or more memory devices 1350. The memory devices 1350 may include the semiconductor apparatus described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

While certain embodiments have been described above, it will be understood to those skilled in the art that the embodiments described are by way of examples only. Accordingly, the error detection circuit and the semiconductor apparatus using the same described should not be limited based on the described embodiments above. Rather, the error detection circuit and the semiconductor apparatus using the same described should only be limited in light of the claims that follow when taken in conjunction with the above description and accompanying figures.

What is claimed is:

1. An error detection circuit comprising:
   a selection circuit configured to sequentially select a primary data group and a secondary data group according to a first control signal, and generate an output signal;
   a first operation circuit configured to perform an error detection operation on the output signal of the selection circuit, and output a result of the error detection operation as a preliminary error operation signal;
   a storage circuit configured to latch the preliminary error operation signal and output a latched signal according to a second control signal;
   a second operation circuit configured to perform an error detection operation on a previous preliminary error operation signal outputted from the storage circuit and a current preliminary error operation signal outputted from the first operation circuit, and generate a result of the error detection operation as an internal error operation signal;
   a comparison circuit configured to compare the internal error operation signal with an external error operation signal, and output a result of the comparison as an error detection signal; and
   a control signal generation circuit configured to generate the first control signal and the second control signal,
   wherein the primary data group is a half of an entire data and the secondary data group is a remaining half, inputted later than the half, of the entire data, and
   wherein the entire data is sequentially inputted through each of a plurality of input/output pads according to a one-time write command, and
   wherein the control signal generation circuit comprises a delay circuit configured to delay the second control signal in order for the storage circuit to output the latched signal of the preliminary error operation signal of the primary data group while the first operation circuit performs an error detection operation on the secondary data group.

2. The error detection circuit according to claim 1, wherein the control signal generation circuit is configured to delay the first control signal by a time corresponding to logic delay of the first operation circuit, and generate the second control signal.

3. The error detection circuit according to claim 1, wherein the control signal generation circuit comprises:
   a buffer configured to buffer an input control clock signal for providing a timing for generating the primary data group and the secondary data group, and output the first control signal; and
   a delay section configured to delay the input control clock signal by a preset delay time and output the second control signal.

4. The error detection circuit according to claim 1, wherein the storage circuit is configured to output a preliminary error operation signal, inputted at a previous timing, at a timing at which the first operation circuit currently outputs a preliminary error operation signal.

5. A semiconductor apparatus comprising:
   a memory block;
   an input data processing circuit configured to align external data according to an input control clock signal and generate alignment data; and
   an error detection circuit configured to sequentially perform a primary error detection operation on a primary data group and a secondary data group of the external data in response to a first control signal, perform a secondary error detection operation on results of the primary error detection operation in response to a second control signal, and generate an error detection signal for determining a presence or an absence of an error of the external data,
   wherein the error detection circuit comprises a control signal generation circuit configured to generate the first control signal and the second control signal,
   wherein the primary data group is a half of an entire data and the secondary data group is a remaining half, inputted later than the half, of the entire data, and
   wherein the entire data are sequentially inputted through each of a plurality of input/output pads according to a one-time write command, and
   wherein the control signal generation circuit comprises a delay circuit configured to delay the second control signal in order for a storage circuit to output a latched signal of a preliminary error operation signal of the primary data group while a first operation circuit performs an error detection operation on the secondary data group.

6. The semiconductor apparatus according to claim 5, further comprising:
   a control block configured to substantially prevent the alignment data from being stored in the memory block according to the error detection signal.

7. The semiconductor apparatus according to claim 5, further comprising:

a control block configured to transmit error occurrence information for requesting data retransmission to an external system having provided the external data when the error detection signal has a logic level defining that the error exists in the external data.

8. The semiconductor apparatus according to claim 5, wherein the error detection circuit comprises:
   a selection circuit configured to sequentially select the primary data group and the secondary data group according to the first control signal, and generate an output signal;
   a first operation circuit configured to perform an error detection operation on the output signal of the selection circuit, and output a result of the error detection operation as a preliminary error operation signal;
   a storage circuit configured to latch the preliminary error operation signal and output a latched signal according to the second control signal;
   a second operation circuit configured to perform the error detection operation on a previous preliminary error operation signal outputted from the storage circuit and a current preliminary error operation signal outputted from the first operation circuit, and generate a result of the error detection operation as an internal error operation signal; and
   a comparison circuit configured to compare the internal error operation signal with an external error operation signal, and output a result of the comparison as the error detection signal.

9. The semiconductor apparatus according to claim 8, wherein the control signal generation circuit is configured to delay the first control signal by a time corresponding to logic delay of the first operation circuit, and generate the second control signal.

10. The semiconductor apparatus according to claim 9, wherein the control signal generation circuit comprises:
   a buffer configured to buffer the input control clock signal and output the first control signal; and
   a delay section configured to delay the input control clock signal by a preset delay time and output the second control signal.

11. The semiconductor apparatus according to claim 8, wherein the storage circuit is configured to output a preliminary error operation signal, inputted at a previous timing, at a timing at which the first operation circuit currently outputs the preliminary error operation signal.

12. An error detection circuit comprising:
   a selection circuit configured to select one of a primary data group and a secondary data group according to a first control signal and to generate an output signal;
   a first operation circuit configured to receive the output signal and perform an error detection operation and generate a preliminary error operation signal;
   a storage circuit configured to output a latch signal by latching the preliminary error operation signal according to a second control signal;
   a second operation circuit configured to perform an error detection operation on the latch signal and the preliminary error operation signal and output an internal error operation signal; and
   a comparison circuit configured to compare the internal error operation signal to an external error operation signal and output an error detection signal; and
   a control signal generation circuit configured to generate the first control signal and the second control signal,
   wherein the primary data group is a half of an entire data and the secondary data group is a remaining half, inputted later than the half, of the entire data, and
   wherein the entire data are sequentially inputted through each of a plurality of input/output pads according to a one-time write command, and
   wherein the control signal generation circuit comprises a delay circuit configured to delay the second control signal in order for the storage circuit to output the latched signal of the preliminary error operation signal of the primary data group while the first operation circuit performs an error detection operation on the secondary data group.

13. The error detection circuit according to claim 12, wherein when the first control signal is activated, the selection circuit is configured to select the secondary data group and generate the output signal.

14. The error detection circuit according to claim 12, wherein when the first control signal is deactivated, the selection circuit is configured to select the primary data group and generate the output signal.

15. The error detection circuit according to claim 12, wherein the selection circuit is configured to sequentially select the primary data group and the secondary data group and to generate the output signal.

* * * * *